United States Patent
Jang et al.

(10) Patent No.: US 8,052,789 B2
(45) Date of Patent: Nov. 8, 2011

(54) POLYCRYSTALLINE SILICON AND CRYSTALLIZATION METHOD THEREOF

(75) Inventors: Jin Jang, Seoul (KR); Jae-Hwan Oh, Seoul (KR); Eun-Hyun Kim, Seoul (KR); Ki-Hyoung Kim, Seoul (KR)

(73) Assignee: Kyunghee University Industrial & Academic Collaboration Foundation, Seoul (KR)

( * ) Notice: Subject to any disclaimer, the term of this patent is extended or adjusted under 35 U.S.C. 154(b) by 1308 days.

(21) Appl. No.: 11/594,135

(22) Filed: Nov. 8, 2006

(65) Prior Publication Data

US 2007/0117286 A1  May 24, 2007

(30) Foreign Application Priority Data

Nov. 8, 2005 (KR) .................. 10-2005-0106369

(51) Int. Cl.
*C30B 1/04* (2006.01)
(52) U.S. Cl. .......... 117/4; 117/8; 117/9; 117/68; 117/70
(58) Field of Classification Search .................. 117/68, 117/69, 70, 4, 8, 9, 938
See application file for complete search history.

(56) References Cited

U.S. PATENT DOCUMENTS

| 7,105,052 B1 * | 9/2006 | Schlenoff | 117/68 |
| 2007/0158611 A1 * | 7/2007 | Oldenburg | 252/71 |

FOREIGN PATENT DOCUMENTS

JP    2002-319606 A    10/2002

OTHER PUBLICATIONS

Girginoudi et el., Journal of Applied Physics, Aug. 15, 1998, vol. 84, No. 4 pp. 1968-1972.
Jang et al., Vacuum vol. 51, No. 4, pp. 769-775, 1998.
lm et el., Appl. Phys. Lett., vol. 64, No. 17, Apr. 25, 1994, pp. 2303-2305.
Pfeiffer et al., "Appl. Phys. Lett." vol. 51, No. 16, Oct. 19, 1987, pp. 1256-1258.

* cited by examiner

*Primary Examiner* — Bob M Kunemund
(74) *Attorney, Agent, or Firm* — Birch, Stewart, Kolasch & Birch, LLP

(57) ABSTRACT

Disclosed are a polycrystalline silicon and a crystallization method thereof according to an exemplary embodiment of the present invention. The polycrystalline silicon comprises: an insulating substrate; and an optical portion formed on the insulating substrate for receiving a CW laser beam and varying the intensity of the beam in order of strength-weakness, strength-weakness, and strength-weakness on one dimension, so that an amorphous silicon thin film is crystallized. Therefore, the present invention can form a good polycrystalline silicon thin film by growing crystal grains with a constant direction and size, when an amorphous silicon thin film disposed on an insulating film such as a glass substrate is crystallized to a polycrystalline silicon thin film.

10 Claims, 5 Drawing Sheets

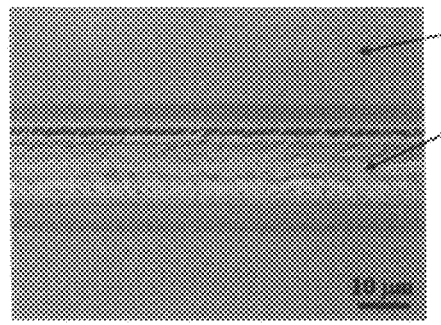 
FIG.5A　　　　　　　　FIG.5B
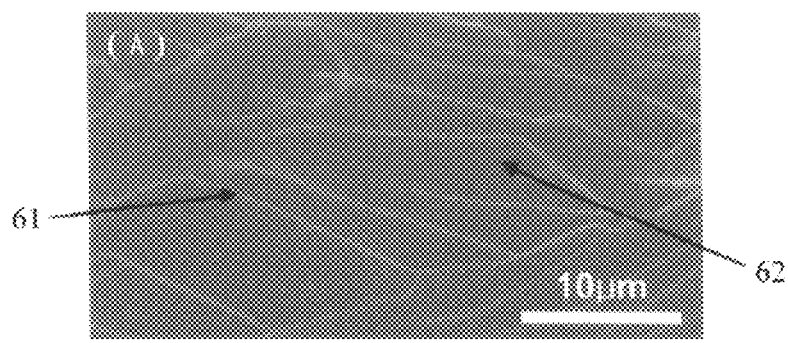
FIG.6A
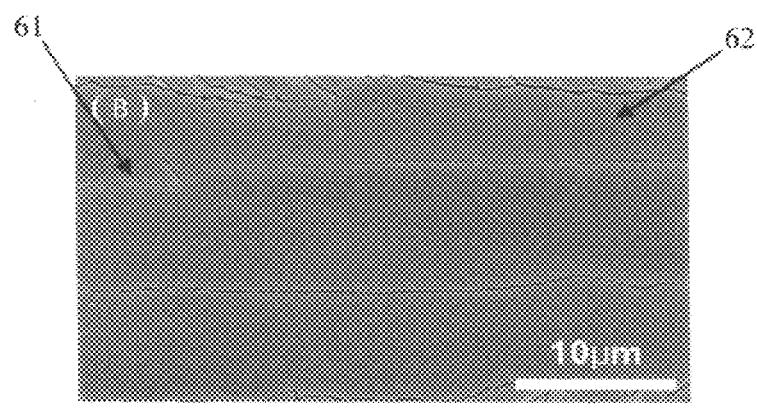
FIG.6B

POLYCRYSTALLINE SILICON AND CRYSTALLIZATION METHOD THEREOF

BACKGROUND OF THE INVENTION

1. Field of the Invention

The present invention relates to polycrystalline silicon, and more particularly, to polycrystalline silicon that can suitably form a good polycrystalline silicon thin film by growing crystal grains with a constant direction and size, when an amorphous silicon thin film disposed on an insulating film such as a glass substrate is crystallized to a polycrystalline silicon thin film, and a crystallization method thereof.

2. Description of the Prior Art

Usually, most of transistor elements using polycrystalline silicon are mainly employed for the active elements of active-matrix liquid crystal displays (AMLCDs), switching elements of electro-luminescence elements, and peripheral circuits.

In this time, the polycrystalline silicon used as a semiconductor active layer is mainly manufactured by using a direct deposition [Jang et al., Vacuum Vol. 51, 769(1998)], a solid Phase Crystallization [Girginoudi et al., J. Appl. Phys. Vol. 84, 1968(1998)], and a laser heat treatment [J. S. Im and H. J. Kim, Appl. Phys. Lett. Vol. 64, 2303(1994)].

The methods except for the direct deposition obtain polycrystalline silicon by inducing a phase transformation through the heat treatment of amorphous silicon disposed on a substrate. In this time, polycrystalline silicon with a structurally and electrically good thin-film property may be obtained when the amorphous silicon is crystallized while being fused and then cooled. As such, the method of forming polycrystalline silicon with a structurally and electrically good thin-film property may be classified into an excimer laser annealing (ELA) method and a sequential lateral solidification (SLS) method.

The ELA method for generating a laser beam in the form of pulses has been widely used to crystallize amorphous silicon because of its good electrical property. The excimer laser may generate a pulsed beam by performing a high-voltage discharge in mixed gases that mix Helium (He) or Neon (Ne) to halogen gases and inert gases. The excimer laser re-crystallizes the amorphous silicon by radiating a short pulse type of laser whose wavelength range lies within that of ultraviolet ray. The crystallization method using the excimer laser has a good property without any lattice defects. On the other hand, the crystallization method, however, requires expensive equipment and has some problems such as difficulty of large-sized area process and the instability of yield, resulting from the instability of a laser.

To compliment the problems, the SLS method, which adjusts the directionality of crystal grains while moving a mask with width of more or less than 5 μm, has been used. However, the SLS method uses expensive equipment, such as an excimer laser, and has to perform complex processes.

To overcome the problems of afore-mentioned methods, a crystallization method using a CW-DPSS (continuous wave diode pumped solid state) laser with a wavelength range of visible light (532 nm), has been recently introduced. This method is similar to the existing methods, considering that an amorphous silicon thin film is melt and solidified using a high power laser. This method has also more similarity to a zone melting recrystallization (ZMR) method [L. Pfeiffer et al., Appl. Phys. Lett. Vol. 51, 1256(1987)], considering that melting silicon continuously exists inside the thin film by a continuously generated laser beam, and a continuous lateral crystallization is induced through the movement of the laser.

The polycrystalline silicon thin film using the CW laser may include directional grains having directionality because the crystallization is performed in parallel with the moving direction of the laser. This method has been popular as a next-generation method of forming high capacity and low temperature polycrystalline silicon [A. Hara et al., AMLCD'01, Tokyo, Japan, pp 227 (2001)], because of lower installation and maintenance costs as well as simpler process than the SLS method.

Nevertheless, this conventional method suffers from the difficulty in adjusting the size and location of crystal grains, which is one of problems in the crystallization method using a CW laser.

SUMMARY

Therefore, the present invention has been made in view of the above problems, and it is an object of the present invention to provide a polycrystalline silicon and a crystallization method thereof that can form a good polycrystalline silicon thin film by growing crystal grains with a constant direction and size, when an amorphous silicon thin film disposed on an insulating film such as a glass substrate is crystallized to a polycrystalline silicon thin film.

According to an aspect of the present invention, there is provided a polycrystalline silicon, which comprises: an insulating substrate; and an optical portion formed on the insulating substrate for receiving a CW laser beam and varying the intensity of the beam in order of strength-weakness, strength-weakness, and strength-weakness on one dimension.

According to another aspect of the present invention, there is provided a crystallization method of a polycrystalline silicon, which comprises: forming an amorphous silicon thin film on an insulating substrate; forming a cylindrical micro-lens on the amorphous silicon thin film; illuminating a CW laser beam on the amorphous silicon thin film; and performing the crystallization of the amorphous silicon thin film.

BRIEF DESCRIPTION OF THE DRAWINGS

The above and other objects, features and advantages of the present invention will be more apparent from the following detailed description taken in conjunction with the accompanying drawing, in which:

FIG. 5(A) is a view illustrating an optical microscope picture of a polycrystalline silicon thin film crystallized by a CW laser, when a cylindrical micro-lens is not employed, according to an exemplary embodiment of the present invention, and FIG. 5(B) is a view illustrating an optical microscope picture of showing an image of a polycrystalline silicon thin film crystallized by the CW laser, when a cylindrical micro-lens is employed, according to an exemplary embodiment of the present invention;

FIG. 6(A) is a view illustrating an scanning electronic microscope picture of a polycrystalline silicon thin film crystallized by a CW laser, when a cylindrical micro-lens is not employed, according to an exemplary embodiment of the present invention, and FIG. 6(B) is a view illustrating an scanning electronic microscope picture of a polycrystalline silicon thin film crystallized by a CW laser, when a cylindrical micro-lens is employed, according to an exemplary embodiment of the present invention;

DETAILED DESCRIPTION OF EXEMPLARY EMBODIMENTS

Hereinafter, an embodiment of a polycrystalline silicon and a crystallization method thereof according to the present invention will be described with reference to the accompanying drawings.

Figure 1:
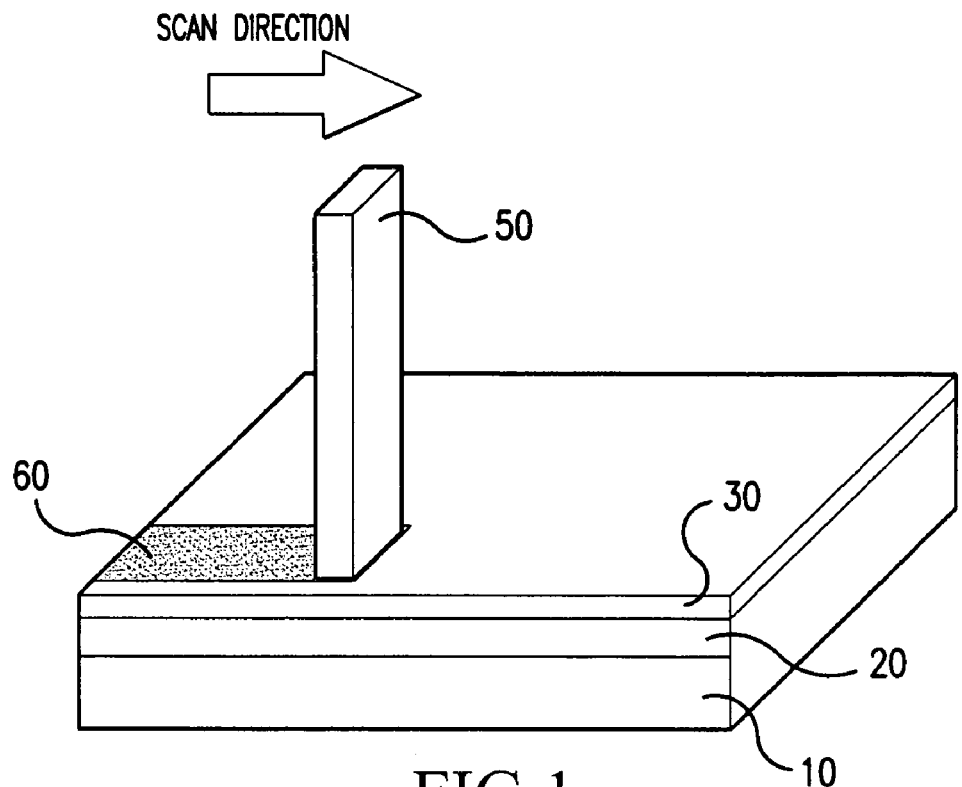
FIG. 1 is a schematic diagram illustrating polycrystalline silicon and a crystalline method thereof according to an exemplary embodiment of the present invention.

Referring to FIG. 1, polycrystalline silicon 60 comprises an insulating substrate 10, and an optical portion formed on the insulating substrate 10 for receiving a CW laser beam 50 and varying the intensity of the beam 50 in order of strength-weakness, strength-weakness, and strength-weakness on one dimension, so that an amorphous silicon thin film 30 is crystallized.

Figure 2:
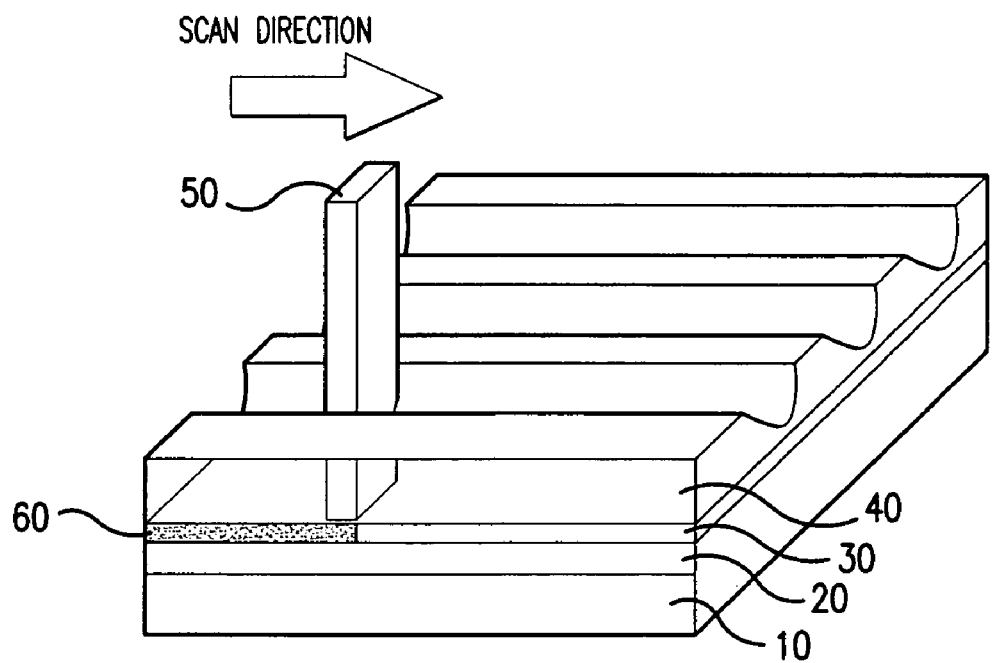
FIG. 2 is a schematic diagram illustrating polycrystalline silicon of FIG. 1 using a cylindrical micro-lens and a crystallization method thereof.
Figure 3:
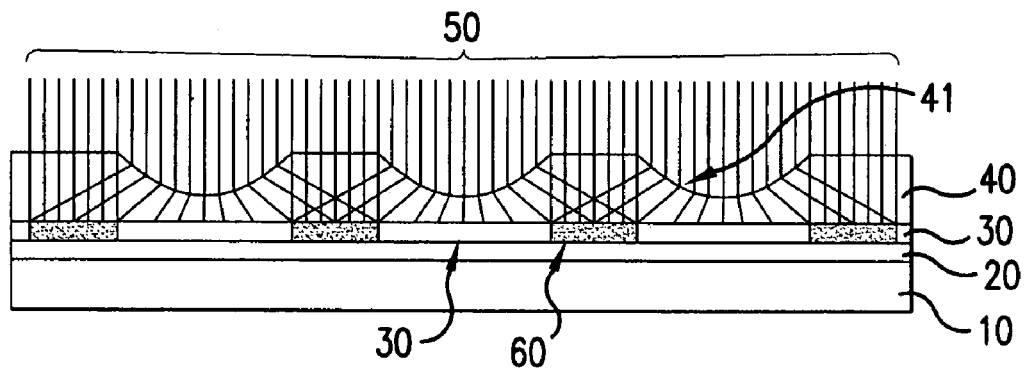
FIG. 3 is a sectional view of the polycrystalline silicon of FIG. 2.

Referring to FIG. 2, the polycrystalline silicon 60 comprises an insulating substrate 10, an amorphous silicon thin film 30 formed on the insulating substrate 10, and a cylindrical micro-lens 40 for receiving a CW laser beam 50 and crystallizing the amorphous silicon thin film 30.

The polycrystalline silicon 60 comprises a buffer layer 20 formed between the insulating substrate 10 and amorphous silicon thin film 30.

The buffer layer 20 is formed of one or two more of a silicon oxide film, a silicon nitride film, a silicon oxynitride film, a silicate film and an organic.

A metal is included in the inside or on a surface of the amorphous silicon thin film 30.

The metal included in the amorphous silicon thin film 30 is Ni or Co.

The metal is deposited on a portion of the surface of the amorphous silicon thin film 30 so as to be crystallized by a metal induced crystallization.

The amorphous silicon thin film 30 is patterned.

The amorphous silicon thin film 30 is patterned in one of patterns including a circle, an ellipse, a triangle, and a square.

The cylindrical micro-lens 40 has a radius ranging from 4 μm to 9000 μm.

The cylindrical micro-lens 40 uses triangular or tetragonal micro-lens.

Two or more of the cylindrical micro-lens 40 are used.

The cylindrical micro-lens 40 is a convex lens or a concave lens.

The cylindrical micro-lens 40 is illuminated with a line beam generated continuously by a scanning method when illuminated by the CW laser beam 50.

When the cylindrical micro-lens 40 is illuminated by the CW laser beam 50, an wavelength range of the CW laser beam 50 comprises one or more of ultraviolet (UV), visible light, and infra-red (IR).

When the cylindrical micro-lens 40 is illuminated by the CW laser beam 50, beam width of the CW laser beam 50 is from 4 μm to 9000 μm.

Figure 4:
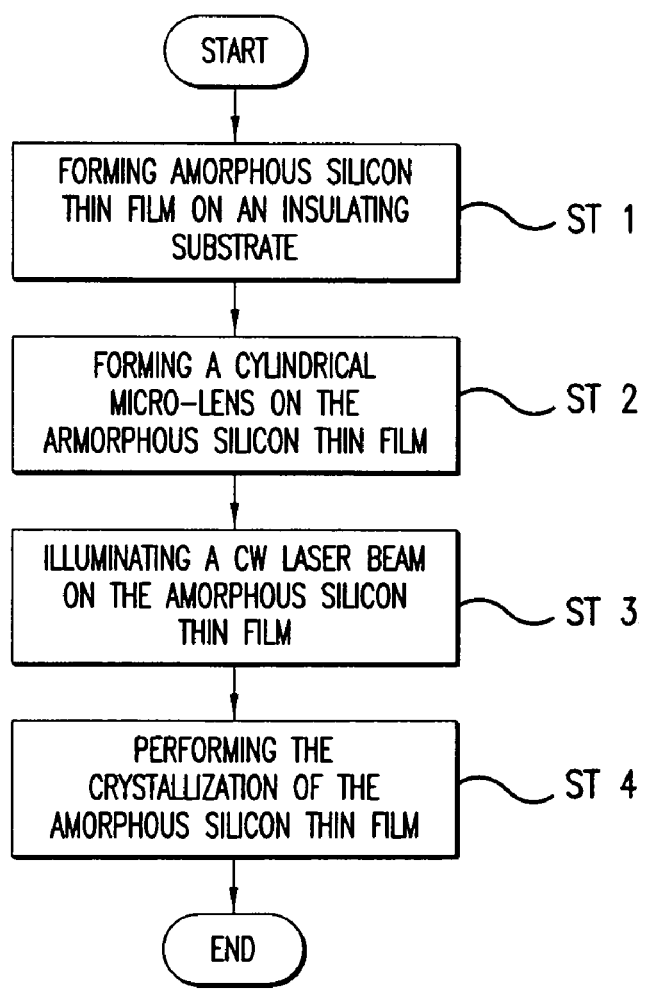
FIG. 4 is a flow chart illustrating a crystallization method of polycrystalline silicon according to an exemplary embodiment of the present invention.

Referring to FIG. 4, A crystallization method of the polycrystalline silicon comprises forming an amorphous silicon thin film on an insulating substrate (ST1), forming a cylindrical micro-lens on the amorphous silicon thin film (ST2), illuminating a CW laser beam on the amorphous silicon thin film a third step (ST3), and performing the crystallization of the amorphous silicon thin film (ST4).

In the step (ST1), a metal is included in the inside or on a surface of the amorphous silicon thin film 30 to form the amorphous silicon thin film 30 by a metal induced crystallization.

The metal for the metal induced crystallization is Ni or Co.

In the step (ST1), a metal is deposited on a portion of the surface of the amorphous silicon thin film 30 to form the amorphous silicon thin film 30 by a metal induced crystallization.

In the step (ST1), the amorphous silicon thin film 30 is patterned.

In the step (ST1), the amorphous silicon thin film 30 is patterned by one of patterns including a circle, an ellipse, a triangle, and a square.

In the step (ST2), the cylindrical micro-lens 40 is replaced by triangular or tetragonal micro-lens.

In the step (ST2), the cylindrical micro-lens 40 is a convex lens or a concave lens.

The step (ST3) comprises a 11-th step of transforming a portion of the amorphous silicon thin film 30 to a liquid phase by illuminating the CW laser beam 50 on the amorphous silicon thin film 30 via the cylindrical micro-lens.

The 11-th step comprises a 12-th step of performing the crystallization, by sequentially forming the transformed liquid phase in the step (ST3) from the portion of the amorphous silicon thin film 30 and simultaneously transforming the other portion of the amorphous silicon thin film 30 from liquid phase to solid phase.

The step (ST3) comprises a 21-th step of transforming a portion of the amorphous silicon thin film 30 from solid phase to crystalline structure by illuminating the CW laser beam 50 on the amorphous silicon thin film 30 via the cylindrical micro-lens 40 and thus heating the portion of the amorphous silicon thin film 30.

The 21-th step comprises a 22-th step of crystallizing the amorphous silicon thin film 30 to a polycrystalline silicon by allowing the heated region in the 21-th step to be sequentially formed from the portion of the amorphous silicon thin film 30 and allowing the crystallized silicon to act as a nucleus.

In the step (ST3), the cylindrical micro-lens 40 is illuminated with a line beam generated continuously by a scanning method when being illuminated by the CW laser beam 50.

In the step (ST3), the wavelength range of the CW laser beam 50 comprises one or more of ultraviolet (UV), visible light, and infra-red (IR).

The step ST3) returns to the step (ST4) so that a polycrystalline silicon is formed on a portion of the amorphous silicon thin film 30 prior to the illumination of the CW laser beam 50 and then the crystallization is performed from the polycrystalline silicon.

The cylindrical micro-lens 40 of the second step and the CW laser beam 50 of the third step are scanned at the same time.

The polycrystalline silicon and crystallization method thereof according to the present invention will be described in detail with reference to the accompanying drawings.

The present invention is to form a good polycrystalline silicon thin film by growing crystal grains with a constant direction and size, when an amorphous silicon thin film disposed on an insulating film such as a glass substrate is crystallized to a polycrystalline silicon thin film.

Referring to FIGS. 1 to 4, an amorphous silicon thin film 30 is formed on an insulating substrate 10, which is a silicon wafer having an insulating film made of glass, quartz, plastics, etc. in the step (ST1). Next, a cylindrical micro-lens 40 is applied on the amorphous silicon thin film 30 in the step (ST2). A CW laser beam 50 is illuminated on the amorphous silicon thin film 30 in the (ST3), and then crystallization is performed in the step (ST4).

In the step (ST3), the CW laser beam 50 is radiated on the amorphous silicon thin film 30 via the cylindrical micro-lens 40 so that a portion of the amorphous silicon thin film 30 is changed to liquid phase. Then, the changed liquid phase is sequentially formed from the portion of the amorphous silicon thin film 30, and simultaneously the other portion of the amorphous silicon thin film 30 is sequentially changed from liquid phase to solid phase. As a result thereof, the crystallization is performed.

Moreover, in the step (ST3), the CW laser beam 50 is radiated on the amorphous silicon thin film 30 via the cylindrical micro-lens 40 so that a portion of the amorphous silicon thin film 30 is heated and then changed from solid phase to crystalline structure. Then, the heated region is sequentially formed on the portion of the amorphous silicon thin film 30. This crystallized portion may act as nuclei so that the amorphous silicon thin film 30 can be crystallized to the polycrystalline silicon.

A crystallization method using only the CW laser beam 50 without the cylindrical micro-lens 40 may be deduced from the schematic process diagram of FIG. 1.

Meanwhile, a buffer layer 20 may be further formed on the insulating substrate 10. The buffer layer 20 is preferably formed of one or more of a silicon oxide film, a silicon nitride film, a silicon oxynitride film, a silicate film, and an organic film.

The term "cylindrical micro-lens 40" means a lens 41 having a few micrometers in radius. That is, the shape of the lens 40 preferably includes a cylinder, a saw-toothed wheel, and a square, each of which has a radius ranging from 1 μm to 9000 μm. In addition, the cylindrical micro-lens 40 should be a substrate made of transparent glass or quartz. The phase change should be initiated only if the CW laser beam 50 is penetrated onto a portion of the amorphous silicon thin film. Then, the phase change is sequentially progressed from the portion to the other portion of the amorphous silicon thin film and at the same time the portion changed into liquid phase is sequentially changed back into solid phase, so that the crystallization is initiated.

In addition, a pattern can be formed on the amorphous silicon thin film 30 when the amorphous silicon thin film 30 is formed. This pattern preferably includes a triangle, a square, a serrated wheel, a ribbon, a star, a round, etc.

Additionally, a metal can be deposited on a portion of the surface of the amorphous silicon thin film 30 so that the amorphous silicon thin film 30 can be crystallized by a metal induced crystallization. The metal required for crystallization may include Ni or Co. After the metal induced crystallization is completed, a re-crystallization can be performed by the CW laser.

Meanwhile, the crystallization using the CW laser beam 50 causes completely fused state to be continuously maintained due to a continuously generated laser beam when the cylindrical micro-lens 40 is formed on the amorphous silicon thin film 30 and then crystallization is performed by the CW laser beam 50. Therefore, the CW laser beam 50 is made to form a continuous line beam by a scanning method.

The polycrystalline silicon 60 crystallized by the illumination of the CW laser beam 50 via the cylindrical micro-lens 40 has the different principle of forming grains 62 from that crystallized by the illumination of the CW laser beam 50 without the cylindrical micro-lens 40. This can be verified from the sectional view of FIG. 3. That is, the crystallization using the cylindrical micro-lens 40 has an advantage, compared to the crystallization without the cylindrical micro-lens 40, in that polycrystalline silicon 60 can be formed at the region, where the crystallization desires to occur, and the size of grains 62 can be varied by the cylindrical micro-lens 40.

In addition, the width of the CW laser beam 50 for heating the amorphous silicon thin film 30 is preferably from 4 μm to 9000 μm. The grains 62 are grown continuously along the scan direction of the CW laser beam 50 so that the crystallization can be progressed.

Referring to FIGS. 5A and 5B, the thermal flux process type of crystallization is progressed on the polycrystalline silicon 60 fabricated by the CW laser beam 50, where the laser beam 50 is continuously scanned on the amorphous silicon thin film in the unit of μs (micro-second) or ms (milli-second) and energy (or heat) is distributed to have a directionality. Accordingly, the center of this thin film has the shape of a brook where a very large grain 62 is arranged, and has the similar shape to that crystallized by the existing ZMR (Zone Melting Recrystallization) method. Therefore, it can be seen that completely fused state is accomplished.

In addition, by an optical microscope picture of the polycrystalline silicon 60 crystallized by the CW laser beam 50 using the cylindrical micro-lens 40, we can conform that greater grains 62 in size than those crystallized without the cylindrical micro-lens 40 and grains with a constant directionality are continuously grown. As such, using a cylindrical micro-lens 40 allows the grain boundary 61 to be reduced by growing grains 62 greatly.

Referring to FIGS. 6A and 6B, a buffer layer 20 with thickness of 200 nm to 2000 nm using an oxide film and an amorphous silicon thin film 30 with a thickness of 40 nm to 1000 nm are sequentially deposited on an insulating substrate 10, and a cleaning process is completed. Next, a cylindrical micro-lens 40 is formed on the amorphous silicon thin film 30 and then a polycrystalline silicon thin film 60 is formed by the illumination of the CW laser beam 50 in the scanning direction.

Accordingly, more grain boundaries are created, and the size of the grains 62 becomes small in the case where the cylindrical micro-lens 40 is not used. If the cylindrical micro-lens is used, however, the grain boundary 61 is lessened and simultaneously has directionality in horizontal direction. As a result thereof, the size of the grains is increased.

Figure 7A:
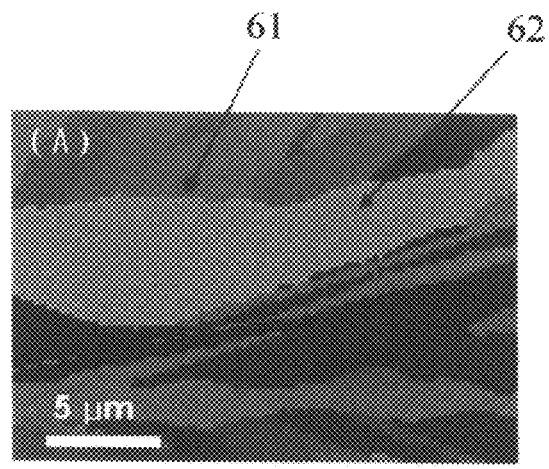
FIG. 7(A) is a view illustrating a picture that measures a polycrystalline silicon thin film crystallized by a CW laser using an electron back-scattered diffraction device, when cylindrical micro-lens is not employed, according to an exemplary embodiment of the present invention.
Figure 7B:
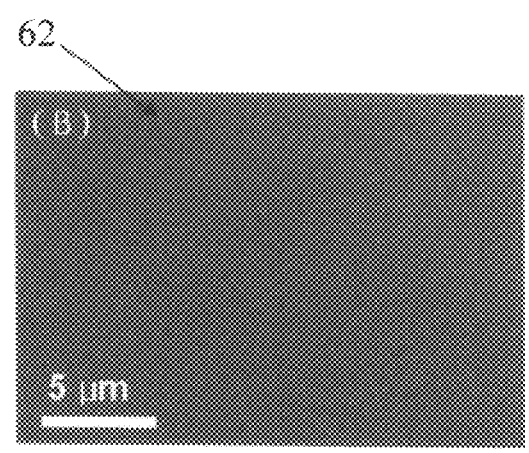
FIG. 7(B) is a view illustrating a picture that measures a polycrystalline silicon thin film crystallized by a CW laser using an electron back-scattered diffraction device, when cylindrical micro-lens is not employed, according to an exemplary embodiment of the present invention.

Referring to FIGS. 7A and 7B, it can be seen that if the cylindrical micro-lens 40 is used, one grain having the direction of <001> and one color can be formed, and the size of the grain is considerably increased in horizontal direction. In the case where the cylindrical micro-lens 40 is not used and the amorphous silicon thin film 30 is crystallized only by the CW laser beam 50, however, various directionality of grain can be occurred and the size of the grain becomes small.

Figure 8A:
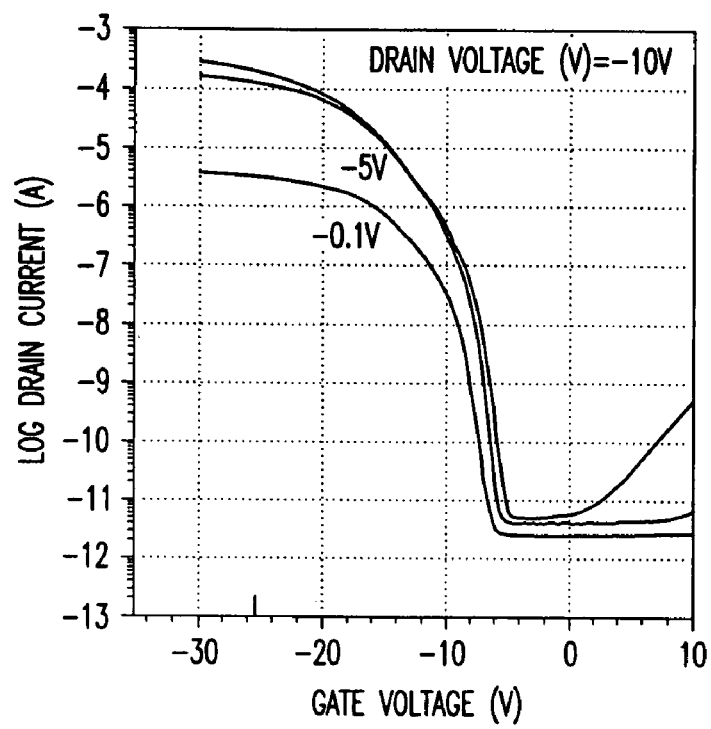
FIG. 8(A) is a graph illustrating a transition property of a polycrystalline silicon thin film transistor crystallized by a CW laser, when a cylindrical micro-lens is not employed, according to an exemplary embodiment of the present invention.
Figure 8B:
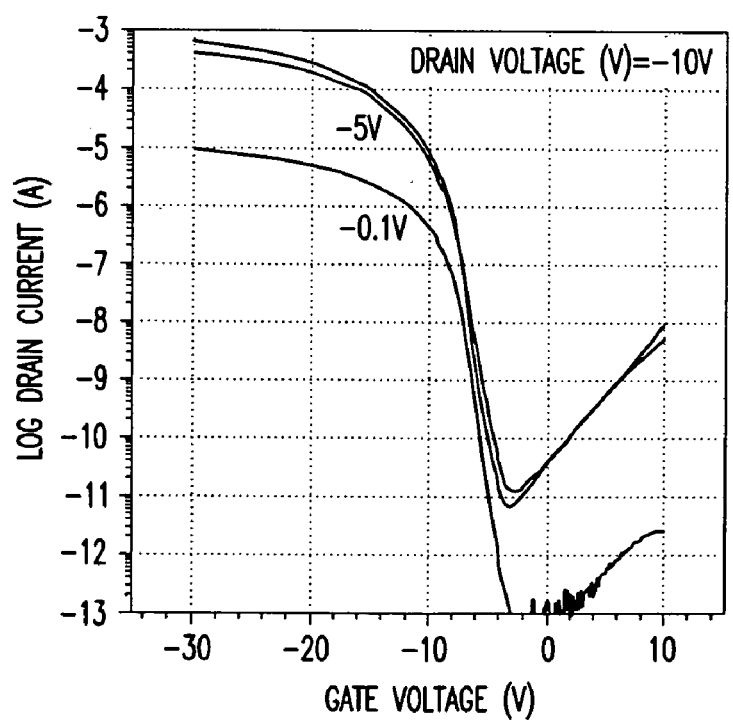
FIG. 8(B) is a graph illustrating a transition property of a polycrystalline silicon thin film transistor crystallized by a CW laser, when a cylindrical micro-lens is not employed, according to an exemplary embodiment of the present invention.

Referring to FIGS. 8A and 8B, the polycrystalline silicon thin film 60 crystallized only by the CW laser beam 50 without the cylindrical micro-lens 40 has field effect mobility of 70 cm2/Vs and the threshold voltage of −9V. However, the polycrystalline silicon thin film 60 crystallized by the CW laser beam 50 using the cylindrical micro-lens 40 has field effect mobility of 231 cm2/Vs and the threshold voltage of −7V. Consequently, it can be seen that the polycrystalline silicon thin film 60 crystallized by the CW laser beam 50 via the cylindrical micro-lens 40 has good electrical property. In addition, it can be seen that the polycrystalline silicon 60 has even greater mobility, and thus the defects of grains such as grain boundaries are greatly decreased.

As described above, the polycrystalline silicon and crystallization method thereof according to the present invention can form the good polycrystalline silicon thin film by growing crystal grains with the constant direction and size, when the amorphous silicon thin film disposed on an insulating film such as a glass substrate is crystallized to the polycrystalline silicon thin film.

The present invention is one of methods for forming a polycrystalline silicon thin film by crystallizing an amorphous silicon thin film and has a novelty in that a cylindrical micro-lens is further provided when the CW laser beam is continuously used in the scanning direction. As a result thereof, the present invention can form the good crystallized polycrystalline silicon thin film. The conventional crystallization technology using the CW laser beam has crystallized the amorphous silicon without a cylindrical micro-lens and accordingly showed the limitation in adjusting the size and location of grains. The present invention can overcome this limitation and improve the directionality of the silicon crystal grains.

Conventionally, the SLS technology has been highlighted as a technology to adjust the grains (crystal grains). However, the SLS technology requires expensive facilities and maintenance costs. The present invention has an effect to replace the SLS technology.

In addition, the present invention can adjust the size and location of grains formed on a polycrystalline silicon thin film and thus can be frequently used for application elements requiring high mobility such as flat panel displays, solar batteries, semiconductor elements and the like.

It should be understood by those of ordinary skill in the art that various replacements, modifications and changes in the form and details may be made therein without departing from the spirit and scope of the present invention as defined by the following claims. Therefore, it is to be appreciated that the above described embodiment are for purposes of illustration only and are not to be construed as limitations of the invention.

What is claimed is:

1. A crystallization method of a polycrystalline silicon comprising:
    (a) forming an amorphous silicon thin film on an insulating substrate;
    (b) forming a cylindrical micro-lens on the amorphous silicon thin film;
    (c) illuminating a CW laser beam on the amorphous silicon thin film; and
    (d) performing the crystallization of the amorphous silicon thin film.

2. The crystallization method of claim 1, wherein the amorphous silicon thin film is patterned in the step (a).

3. The crystallization method of claim 1, wherein the cylindrical micro-lens is replaced by triangular or tetragonal micro-lens in the step (b).

4. The crystallization method of claim 1, wherein the cylindrical micro-lens is a convex lens or a concave lens in the step (b).

5. The crystallization method of claim 1, wherein the step (c) comprises: (e) transforming a portion of the amorphous silicon thin film to a liquid phase by illuminating the CW laser beam on the amorphous silicon thin film via the cylindrical micro-lens.

6. The crystallization method of claim 5, wherein the step (e) comprises: (f) performing the crystallization, by sequentially forming the liquid phase transformed in the step (c) from one portion of the amorphous silicon thin film and simultaneously transforming the other portion of the amorphous silicon thin film from liquid phase to solid phase.

7. The crystallization method of claim 1, wherein the step (c) comprises: (g) transforming a portion of the amorphous silicon thin film from solid phase to crystalline structure by illuminating the CW laser beam on the amorphous silicon thin film via the cylindrical micro-lens and thus heating the portion of the amorphous silicon thin film.

8. The crystallization method of claim 7, wherein the step (g) comprises: (h) crystallizing the amorphous silicon thin film to a polycrystalline silicon by allowing the heated region in the step (c) to be sequentially formed from the portion of the amorphous silicon thin film and allowing the crystallized silicon to act as a nucleus.

9. The crystallization method of claim 1, wherein the cylindrical micro-lens is illuminated with a line beam generated continuously by a scanning method when being illuminated by the CW laser beam in the step (c).

10. The crystallization method of claim 1, wherein the step (c) returns to the step (d) so that a polycrystalline silicon is formed on a portion of the amorphous silicon thin film prior to the illumination of the CW laser beam and then the crystallization is performed from the polycrystalline silicon.

* * * * *